(12) United States Patent
Kurokawa et al.

(10) Patent No.: US 9,389,720 B2
(45) Date of Patent: Jul. 12, 2016

(54) TOUCH PANEL AND ELECTRONIC DEVICE

(71) Applicant: SEMICONDUCTOR ENERGY LABORATORY CO., LTD., Atsugi-shi, Kanagawa-ken (JP)

(72) Inventors: Yoshiyuki Kurokawa, Kanagawa (JP); Konami Izumi, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 14/470,967

(22) Filed: Aug. 28, 2014

(65) Prior Publication Data

US 2014/0368760 A1 Dec. 18, 2014

Related U.S. Application Data

(63) Continuation of application No. 12/686,564, filed on Jan. 13, 2010, now Pat. No. 8,847,916.

(30) Foreign Application Priority Data

Jan. 21, 2009 (JP) ................................. 2009-010764

(51) Int. Cl.
*G06F 3/041* (2006.01)
*G06F 3/042* (2006.01)
*G02F 1/1333* (2006.01)
*G09G 3/36* (2006.01)
*B81B 3/00* (2006.01)
*H01L 21/12* (2006.01)
(Continued)

(52) U.S. Cl.
CPC ............ *G06F 3/0412* (2013.01); *B81B 3/0021* (2013.01); *G02F 1/13338* (2013.01); *G06F 3/042* (2013.01); *G06F 3/0416* (2013.01); *G09G 3/3648* (2013.01); *H01L 27/1225* (2013.01); *H01L 27/1446* (2013.01); *B81B 2201/0264* (2013.01); *G02F 2201/44* (2013.01)

(58) Field of Classification Search
USPC .................. 345/73–104, 204–215, 690–699, 345/156–184; 178/18.01–20.04; 315/169.1–169.4
See application file for complete search history.

(56) References Cited

U.S. PATENT DOCUMENTS 6,396,471 B1   5/2002   Hirakata
6,597,348 B1   7/2003   Yamazaki et al.
6,628,263 B1   9/2003   Konuma et al.
(Continued)

FOREIGN PATENT DOCUMENTS

JP   2001-154780 A   6/2001
JP   2001-292276 A   10/2001
(Continued)

*Primary Examiner* — Patrick F Marinelli
(74) *Attorney, Agent, or Firm* — Nixon Peabody LLP; Jeffrey L. Costellia

(57) ABSTRACT

To provide a touch panel with reduced disturbance of display and with improved mechanical strength by suppressing variation in the space between a pair of substrates which form the touch panel even when in contact with an object to be detected. A pixel portion including a plurality of pixels is provided between a pair of substrates. Each pixel includes a photosensor portion which detects that the object to be detected is in contact with one of the pair of substrates, and a MEMS portion which generates a mechanical displacement in a direction perpendicular to the pair of substrates when a signal based on a detection result of the photosensor portion is input.

15 Claims, 8 Drawing Sheets

(51) Int. Cl.
*H01L 27/144* (2006.01)
*H01L 27/12* (2006.01)

(56) References Cited

U.S. PATENT DOCUMENTS

| | | | |
|---|---|---|---|
| 6,638,781 B1 | 10/2003 | Hirakata et al. | |
| 6,747,290 B2 | 6/2004 | Yamazaki et al. | |
| 6,747,638 B2 | 6/2004 | Yamazaki et al. | |
| 6,844,868 B2 | 1/2005 | Hirakata | |
| 6,972,753 B1 | 12/2005 | Kimura et al. | |
| 7,068,254 B2 | 6/2006 | Yamazaki et al. | |
| 7,068,255 B2 | 6/2006 | Hirakata | |
| 7,173,281 B2 | 2/2007 | Hirakata et al. | |
| 7,365,750 B2 | 4/2008 | Yamazaki et al. | |
| 7,394,919 B2 | 7/2008 | Rowe et al. | |
| 7,525,523 B2 | 4/2009 | Yamazaki et al. | |
| 7,528,529 B2 | 5/2009 | Yamaguchi et al. | |
| 7,537,953 B2 | 5/2009 | Tateishi et al. | |
| 7,560,789 B2 | 7/2009 | Izumi et al. | |
| 7,602,373 B2 | 10/2009 | Hirakata | |
| 7,605,902 B2 | 10/2009 | Hirakata et al. | |
| 7,610,794 B2 | 11/2009 | Yamaguchi et al. | |
| 7,642,114 B2 | 1/2010 | Yamaguchi et al. | |
| 7,642,612 B2 | 1/2010 | Izumi et al. | |
| 7,755,582 B2 | 7/2010 | Hagood et al. | |
| 8,847,916 B2* | 9/2014 | Kurokawa et al. | 345/175 |
| 2004/0174324 A1* | 9/2004 | Yamazaki et al. | 345/76 |
| 2006/0066537 A1 | 3/2006 | Kimura et al. | |
| 2006/0098266 A1* | 5/2006 | Payne et al. | 359/291 |
| 2006/0108675 A1 | 5/2006 | Colgan et al. | |
| 2006/0267153 A1 | 11/2006 | Yamaguchi et al. | |
| 2006/0283917 A1* | 12/2006 | Jin | 228/112.1 |
| 2007/0001224 A1 | 1/2007 | Yamaguchi et al. | |
| 2007/0037311 A1 | 2/2007 | Izumi et al. | |
| 2007/0075942 A1 | 4/2007 | Martin et al. | |
| 2007/0078228 A1 | 4/2007 | Tateishi et al. | |
| 2007/0093045 A1 | 4/2007 | Yamaguchi et al. | |
| 2007/0143048 A1 | 6/2007 | Yamaguchi et al. | |
| 2007/0215963 A1 | 9/2007 | Yamaguchi et al. | |
| 2007/0218630 A1 | 9/2007 | Yamaguchi et al. | |
| 2007/0222762 A1 | 9/2007 | Van Delden et al. | |
| 2007/0238213 A1 | 10/2007 | Yamaguchi et al. | |
| 2008/0158217 A1 | 7/2008 | Hata et al. | |
| 2008/0176046 A1 | 7/2008 | Yamaguchi et al. | |
| 2008/0237805 A1 | 10/2008 | Ohnuma | |
| 2008/0266242 A1* | 10/2008 | Arthur et al. | 345/103 |
| 2009/0002328 A1 | 1/2009 | Ullrich et al. | |
| 2009/0040445 A1 | 2/2009 | Hirakata et al. | |
| 2009/0096779 A1 | 4/2009 | Ikegami | |
| 2009/0127081 A1 | 5/2009 | Mikami et al. | |
| 2009/0141004 A1 | 6/2009 | Yamazaki | |
| 2009/0145629 A1 | 6/2009 | Mikami et al. | |
| 2009/0201269 A1 | 8/2009 | Kato et al. | |
| 2009/0230815 A1 | 9/2009 | Yamaguchi et al. | |
| 2009/0242896 A1 | 10/2009 | Izumi et al. | |
| 2009/0295769 A1 | 12/2009 | Yamazaki et al. | |
| 2010/0300862 A1* | 12/2010 | Tamura et al. | 200/600 |
| 2011/0075245 A1* | 3/2011 | Hashimura et al. | 359/291 |
| 2011/0109593 A1* | 5/2011 | Kurokawa et al. | 345/175 |
| 2011/0122108 A1* | 5/2011 | Kozuma et al. | 345/207 |
| 2011/0148835 A1* | 6/2011 | Yamazaki | 345/207 |
| 2011/0199351 A1* | 8/2011 | Kurokawa | 345/207 |
| 2011/0205209 A1* | 8/2011 | Kurokawa et al. | 345/211 |

FOREIGN PATENT DOCUMENTS

| | | |
|---|---|---|
| JP | 2002-033823 A | 1/2002 |
| JP | 2006-091462 A | 4/2006 |
| JP | 2006-285785 A | 10/2006 |
| JP | 2007-183706 A | 7/2007 |
| JP | 2008-262204 A | 10/2008 |
| JP | 2010-532043 | 9/2010 |
| WO | WO-2009/002605 | 12/2008 |

* cited by examiner

TOUCH PANEL AND ELECTRONIC DEVICE

BACKGROUND OF THE INVENTION

1. Field of the Invention

The present invention relates to a touch panel having a touch sensor. In addition, the present invention relates to an electronic device provided with the touch panel.

2. Description of the Related Art

In recent years, a display device provided with a touch sensor has attracted attention. The display device provided with a touch sensor is called a touch panel, a touch screen, and the like (hereinafter simply referred to as a "touch panel"). Examples of the touch sensor include a resistive touch sensor, a capacitance touch sensor, and an optical touch sensor, which are different from each other in operation principle. In any of the sensors, an object to be detected is in contact with a display device or in the vicinity of the display device, whereby data can be input.

By provision of a sensor (also referred to as a "photosensor") that detects light as an optical touch sensor for a touch panel, a display screen serves as an input region. As an example of a device including such an optical touch sensor, a display device having an image capturing function, which is provided with a contact area sensor that captures an image, is given (e.g., see Reference 1). In the touch panel having an optical sensor, light is emitted from the touch panel. In the case where an object to be detected exists at a given position of the touch panel, light at the region where the object to be detected exists is blocked by the object to be detected, and part of light is reflected. A photosensor (also referred to as a "photoelectric conversion element") which can detect light is provided in a pixel of the touch panel, and the photosensor detects the reflected light, so that the existence of the object to be detected in the region where light is detected can be recognized.

In addition, it has been attempted to give a personal authentication function or the like to an electronic device typified by a portable information terminal such as a mobile phone (e.g., see Reference 2). A finger print, a face, a hand print, a palm print, a pattern of a hand vein, and the like are used for personal authentication. In the case where a portion different from the display portion has a personal authentication function, the number of components increases, and the weight or price of the electronic device could possibly increase.

In addition, in touch sensor systems, known is a technique for selecting an image processing method by which the position of a finger-tip is detected in accordance with brightness of external light (e.g., see Reference 3).

[Reference]

Reference 1: Japanese Published Patent Application No. 2001-292276

Reference 2: Japanese Published Patent Application No. 2002-033823

Reference 3: Japanese Published Patent Application No. 2007-183706

SUMMARY OF THE INVENTION

In the case where a photosensor as an optical touch sensor is used for a touch panel, an object to be detected is in contact with the touch panel or in the vicinity of the touch panel, so that the object is detected. Contact between the object to be detected and the touch panel generates a physical force in a direction perpendicular to a substrate of the touch panel due to pressure applied from the object to be detected. For example, in the case of a touch panel using a liquid crystal panel, when the physical force acts in a direction perpendicular to a substrate of the touch panel, the space between a pair of substrates (a TFT substrate and a counter substrate) which seal a liquid crystal becomes small locally, and display is disturbed. Particularly in recent years, as a result of desire for thin liquid crystal panels and EL panels, substrates for the liquid crystal panels and the EL panels are now getting thinner. The TFT substrate is held in a sturdy chassis, so that the mechanical strength of the TFT substrate can be maintained. In that case, however, a counter substrate is bent, and it becomes difficult to maintain the mechanical strength.

In view of the foregoing problem, an object of one embodiment of the present invention is to provide a touch panel in which a change in the space between a pair of substrates that form the touch panel when an object to be detected is in contact with the touch panel is suppressed so that display is not disturbed and the mechanical strength is improved.

According to one embodiment of the present invention, a photosensor and a minute electromechanical switch (hereinafter referred to as a MEMS element) are mounted on a pixel; whether or not an object to be detected is in contact with a touch panel is determined from an electrical signal obtained from the photosensor; and a MEMS element in a region where the contact of the touch panel is detected is operated. Accordingly, stress in a perpendicular direction is generated between a pair of substrates (a TFT substrate and a counter substrate) which form the touch panel. In this manner, even when the object to be detected is in contact with the touch panel, a constant distance between the pair of substrates can be kept. Therefore, disturbance of display can be reduced. In addition, even when a structure in which the TFT substrate is held in a chassis is used, a bend of the counter substrate can be reduced and the mechanical strength can be improved.

According to one embodiment of the present invention, a pixel portion including a plurality of pixels is provided between a pair of substrates. Each pixel includes a photosensor portion which detects that an object to be detected is in contact with one of the pair of substrates, and a MEMS portion which generates a mechanical displacement in a direction perpendicular to the pair of substrates when a signal based on a detection result of the photosensor portion is input.

The pixel includes a display element portion having a liquid crystal element and a first transistor that controls the liquid crystal element. Alternatively, the pixel includes a display element portion having a light-emitting element and a first transistor that controls the light-emitting element. In addition, the first transistor may be a thin film transistor.

The photosensor portion includes a photodiode and a second transistor that controls the photodiode. The MEMS portion includes a MEMS element and a third transistor that controls the MEMS element. The second transistor and the third transistor may be thin film transistors.

According to one embodiment of the present invention, even when an object to be detected is in contact with a touch panel, a constant distance between a pair of substrates which form a touch panel can be kept. Therefore, disturbance of display can be reduced. In addition, even when a TFT substrate is held in a chassis, a bend of a counter substrate can be reduced and the mechanical strength can be improved.

DETAILED DESCRIPTION OF THE INVENTION

Embodiments of the present invention will be hereinafter described in detail with reference to the accompanying drawings. Note that the present invention is not limited to the description below, and it is easily understood by those skilled in the art that the modes and details of the present invention can be modified in a variety of ways without departing from the spirit and scope of the present invention. Therefore, the present invention should not be interpreted as being limited to the descriptions of the embodiments below.

(Embodiment 1)

In this embodiment, a touch panel will be described with reference to FIGS. 1 to 4.

Figure 1:
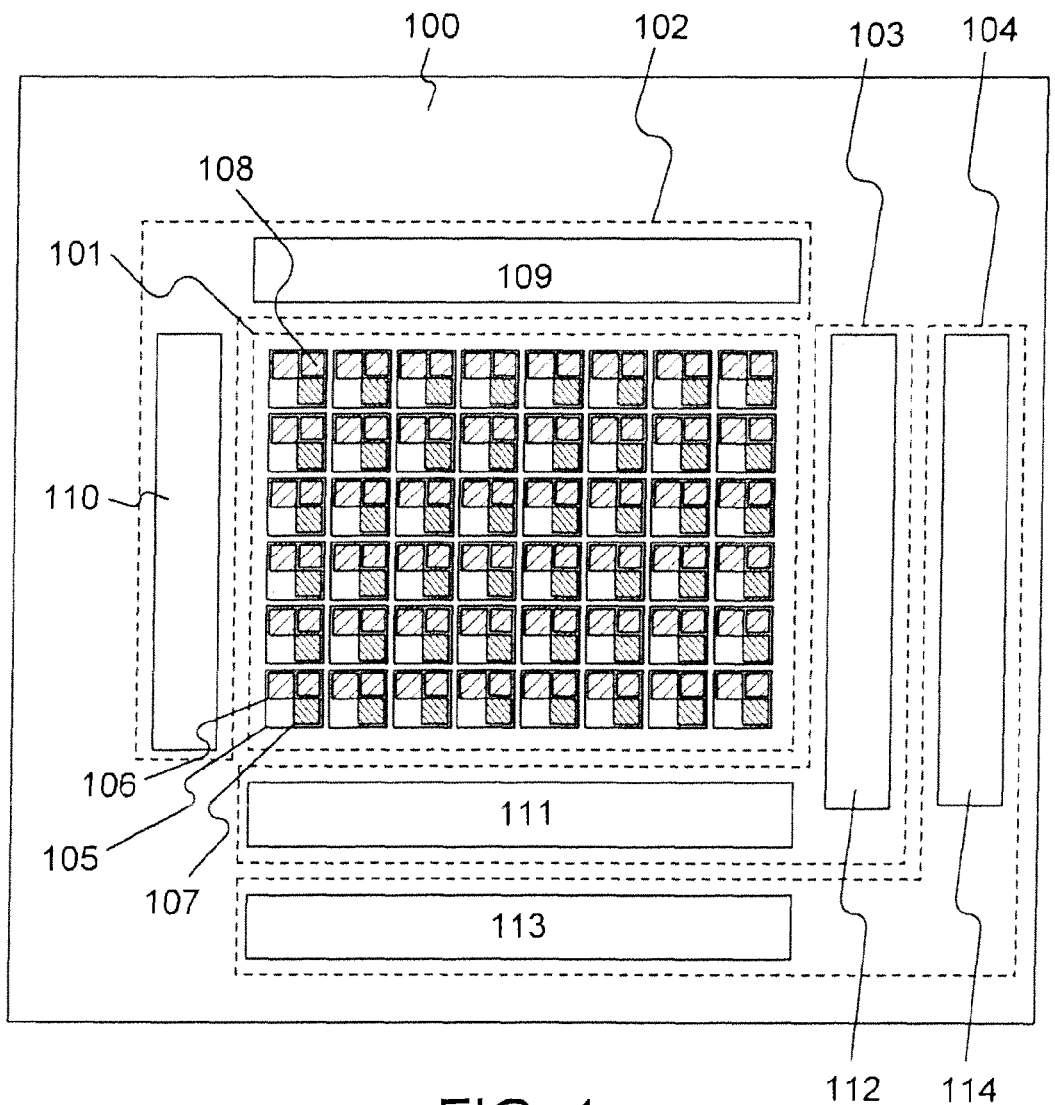
FIG. 1 illustrates a structure of a touch panel.

First, a structure of a touch panel 100 is described with reference to FIG. 1. The touch panel 100 includes a pixel portion 101, a display element control circuit 102, a photosensor control circuit 103, and a MEMS control circuit 104.

The pixel portion 101 includes a plurality of pixels 105 arranged in matrix in a row direction and a columnar direction. Each pixel 105 includes a display element portion 106, a photosensor portion 107, and a MEMS portion 108.

The display element portion 106 includes a thin film transistor (TFT), a storage capacitor, a liquid crystal element in which a liquid crystal layer is sandwiched between a pixel electrode and a counter electrode, a color filter, and the like. In the touch panel 100, since a polarization direction varies when voltage is applied to the liquid crystal layer, the tone (gradation) of light which penetrates the liquid crystal layer is formed to realize image display. For the light which penetrates the liquid crystal layer, external light or light of a light source (backlight) emitted from a back surface of the touch panel 100 is used. In addition, the light which penetrates the liquid crystal layer penetrates the color filter, so that gradation of specific colors (e.g., R, G, and B) can be made and color image display can be realized. The storage capacitor has a function of holding a charge that corresponds to the voltage which is applied to the liquid crystal layer. The thin film transistor has a function of controlling injection or discharge of charge to the storage capacitor.

Note that the case in which the display element portion 106 includes the liquid crystal element is described; however, other elements such as a light-emitting element may be included.

The photosensor portion 107 includes an element having a function of generating an electrical signal by reception of light, such as a photodiode, and the photosensor portion 107 also includes a transistor which controls the element, and the like. Note that reflected light or transmitted light when an object to be detected is irradiated with external light or backlight can be received by the photosensor portion 107. Here, with the use of the color filter, the pixel 105 having a function of exhibiting red (R) is referred to as an R pixel; the pixel 105 having a function of exhibiting green (G) is referred to as a G pixel; and the pixel 105 having a function of exhibiting blue (B) is referred to as a B pixel. Note that when the object to be detected is irradiated with the external light or the backlight, R, G, and B of the reflected light or the transmitted light can be respectively extracted by the photosensor portion 107 included in the R pixel, the photosensor portion 107 included in the G pixel, and the photosensor portion 107 included in the B pixel.

The MEMS portion 108 includes an element having a function of causing a mechanical displacement by an electrical signal, for example, a MEMS element such as a piezoelectric element using piezoelectric ceramics having a piezoelectric effect or a parallel-plate electrostatic actuator using electrostatic force; a transistor which controls the MEMS element; a storage capacitor which holds a potential to be applied to the MEMS element; and the like.

The display element control circuit 102 is a circuit which controls the display element portion 106. The display element control circuit 102 includes a display-element-signal-line driver circuit 109 which inputs a signal to the display element portion 106 through a signal line (also referred to as a "source signal line"), and a display-element-scan-line driver circuit 110 which inputs a signal to the display element portion 106 through a scan line (also referred to as a "gate signal line"). For example, the display-element-scan-line driver circuit 110 has a function of selecting the display element portion 106 included in pixels in a specific row. In addition, the display-element-signal-line driver circuit 109 has a function of applying a given potential to the display element portion 106 included in the pixels of the selected row. Note that in the display element portion 106 to which a high potential is applied by the display-element-scan-line driver circuit 110, the thin film transistor included in the display element portion 106 becomes a conductive state, and charge that is provided by the display-element-signal-line driver circuit 109 on the signal line side is supplied. The supplied charge is stored in the storage capacitor included in the display element portion 106, and a potential is held.

The photosensor control circuit 103 is a circuit which controls the photosensor portion 107. The photosensor control circuit 103 includes a photosensor-signal-line reading circuit 111 and a photosensor-scan-line driver circuit 112. For example, the photosensor-scan-line driver circuit 112 has a function of selecting the photosensor portion 107 included in pixels arranged in a specific row. In addition, the photosensor-signal-line reading circuit 111 has a function of extracting an output signal of the photosensor portion 107 included in the pixels of the selected row.

The MEMS control circuit 104 is a circuit which controls the MEMS portion 108. The MEMS control circuit 104 includes a MEMS-signal-line driver circuit 113 and a MEMS-scan-line driver circuit 114. For example, the MEMS-scan-line driver circuit 114 has a function of selecting the MEMS portion 108 included in pixels arranged in a specific row. In addition, the MEMS-signal-line driver circuit 113 has a function of supplying a potential which is applied to the MEMS portion 108 included in the pixels of the selected row.

Figure 2:
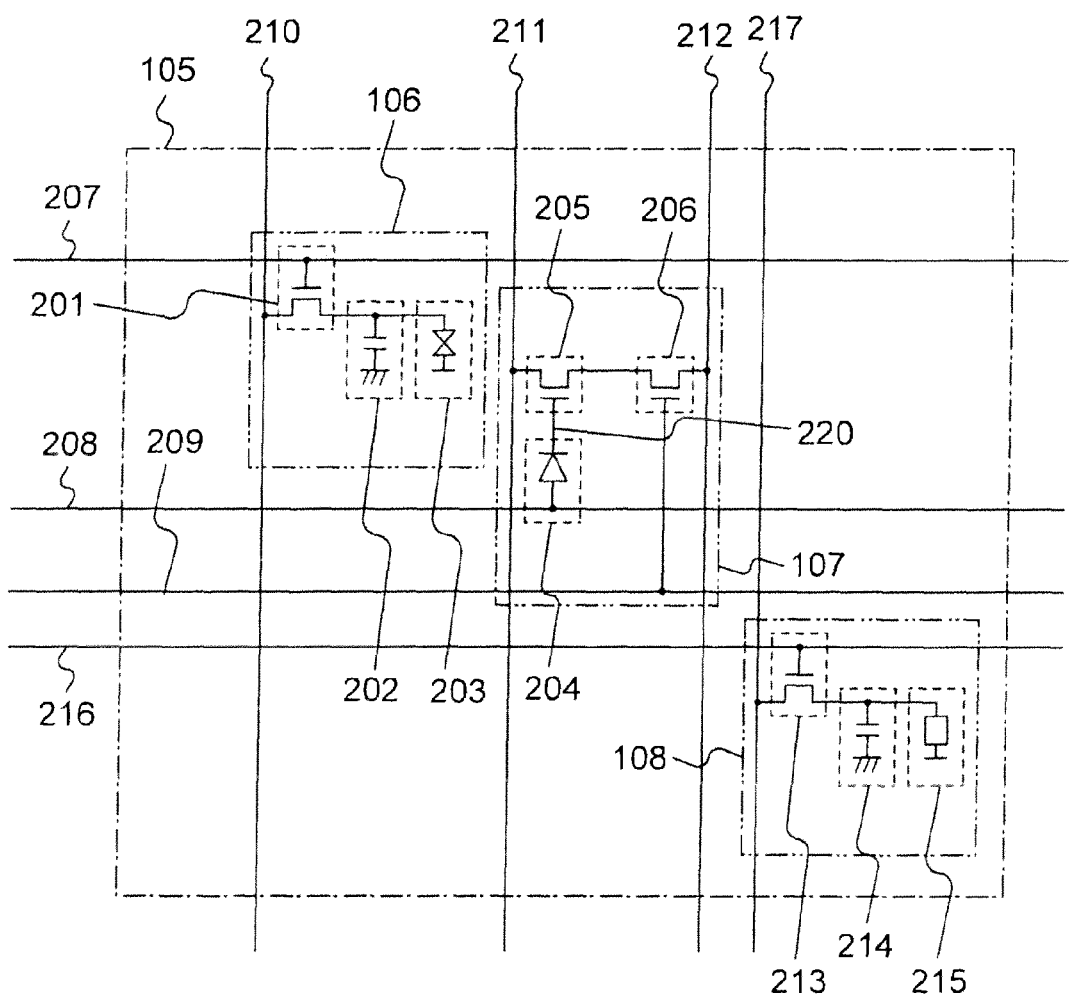
FIG. 2 illustrates a structure of a touch panel.

A circuit diagram of the pixel 105 is described with reference to FIG. 2. The pixel 105 includes the display element portion 106, the photosensor portion 107, and the MEMS portion 108. The display element portion 106 includes a transistor 201, a storage capacitor 202, and a liquid crystal element 203. The photosensor portion 107 includes a photodiode 204, a transistor 205, and a transistor 206. The MEMS portion 108 includes a transistor 213, a storage capacitor 214, and a MEMS element 215.

A gate of the transistor 201 is electrically connected to a gate signal line 207, one of a source and a drain of the transistor 201 is electrically connected to a video data signal line 210, and the other of the source and the drain of the transistor 201 is electrically connected to one electrode of the storage capacitor 202 and one electrode of the liquid crystal element 203. The other electrode of the storage capacitor 202 and the other electrode of the liquid crystal element 203 are each held at a certain potential. The liquid crystal element 203 is an element including a pair of electrodes and a liquid crystal layer sandwiched between the pair of electrodes.

One electrode of the photodiode 204 is electrically connected to a photodiode reset signal line 208, and the other electrode of the photodiode 204 is electrically connected to a gate of the transistor 205. One of a source and a drain of the transistor 205 is electrically connected to a photosensor output signal line 211, and the other of the source and the drain of the transistor 205 is electrically connected to one of a source and a drain of the transistor 206. A gate of the transistor 206 is electrically connected to a gate signal line 209, and the other of the source and the drain of the transistor 206 is electrically connected to a photosensor reference signal line 212.

A gate of the transistor 213 is electrically connected to a gate signal line 216, one of a source and a drain of the transistor 213 is electrically connected to a MEMS driver signal line 217, and the other of the source and the drain of the transistor 213 is electrically connected to one electrode of the storage capacitor 214 and one electrode of the MEMS element 215. The other electrode of the storage capacitor 214 and the other electrode of the MEMS element 215 are each held at a certain potential.

Then, the operation of the display element portion 106 is described with reference to FIG. 2. In the transistor 201 included in the display element portion 106, when "H" (high) is applied to the gate signal line 207, a potential of the video data signal line 210 is applied to the storage capacitor 202 and the liquid crystal element 203. The storage capacitor 202 holds the applied potential. The liquid crystal element 203 changes light transmittance in accordance with the applied potential.

Figure 3:
FIG. 3 illustrates a timing diagram.

Next, the operation of the photosensor portion 107 is described with reference to FIGS. 2 and 3. In FIG. 3, a signal 301 corresponds to a potential of the photodiode reset signal line 208; a signal 302 corresponds to a potential of the gate signal line 209 to which the gate of the transistor 206 is electrically connected; a signal 303 corresponds to a potential of a gate signal line 220 to which the gate of the transistor 205 is electrically connected; and a signal 304 corresponds to a potential of the photosensor output signal line 211.

The photodiode 204 is brought into conduction when "H" is applied to the photodiode reset signal line 208, and a potential of the gate signal line 220 to which the gate of the transistor 205 is electrically connected is set to "H" (see period T1 in FIG. 3). Next, when "L" (low) is applied to the photodiode reset signal line 208, with the off current of the photodiode 204, the potential of the gate signal line 220 to which the gate of the transistor 205 is electrically connected (see period T2 in FIG. 3) decreases. The off current of the photodiode 204 increases when light is emitted; therefore, the potential of the gate signal line 220 to which the gate of the transistor 205 is electrically connected varies in accordance with the amount of light to be emitted. That is, the source-drain current of the transistor 205 (current which flows between the source and the drain of the transistor 205) varies.

Next, when the "H" level is applied to the gate signal line 209 to which the gate of the transistor 206 is electrically connected and the transistor 206 is brought into conduction (see period T3 in FIG. 3), the photosensor reference signal line 212 and the photosensor output signal line 211 are brought into conduction through the transistor 205 and the transistor 206. When the photosensor output signal line 211 is pre-charged to the level of "H" in advance, the potential of the photosensor output signal line 211 decreases. Here, the rate of decreasing the potential of the photosensor output signal line 211 depends on the source-drain current of the transistor 205. That is, the rate of decreasing the potential of the photosensor output signal line 211 varies in accordance with the amount of light with which the photodiode 204 is irradiated.

Lastly, the operation of the MEMS portion 108 is described with reference to FIG. 2. In the transistor 213 included in the MEMS portion 108, when "H" is applied to the gate signal line 216 to which the gate of the transistor 213 is electrically connected, the potential of the MEMS driver signal line 217 is applied to the storage capacitor 214 and the MEMS element 215. The storage capacitor 214 holds the applied potential. The applied potential causes the MEMS element 215 to generate a mechanical displacement in a direction perpendicular to a touch panel surface.

Figure 4:
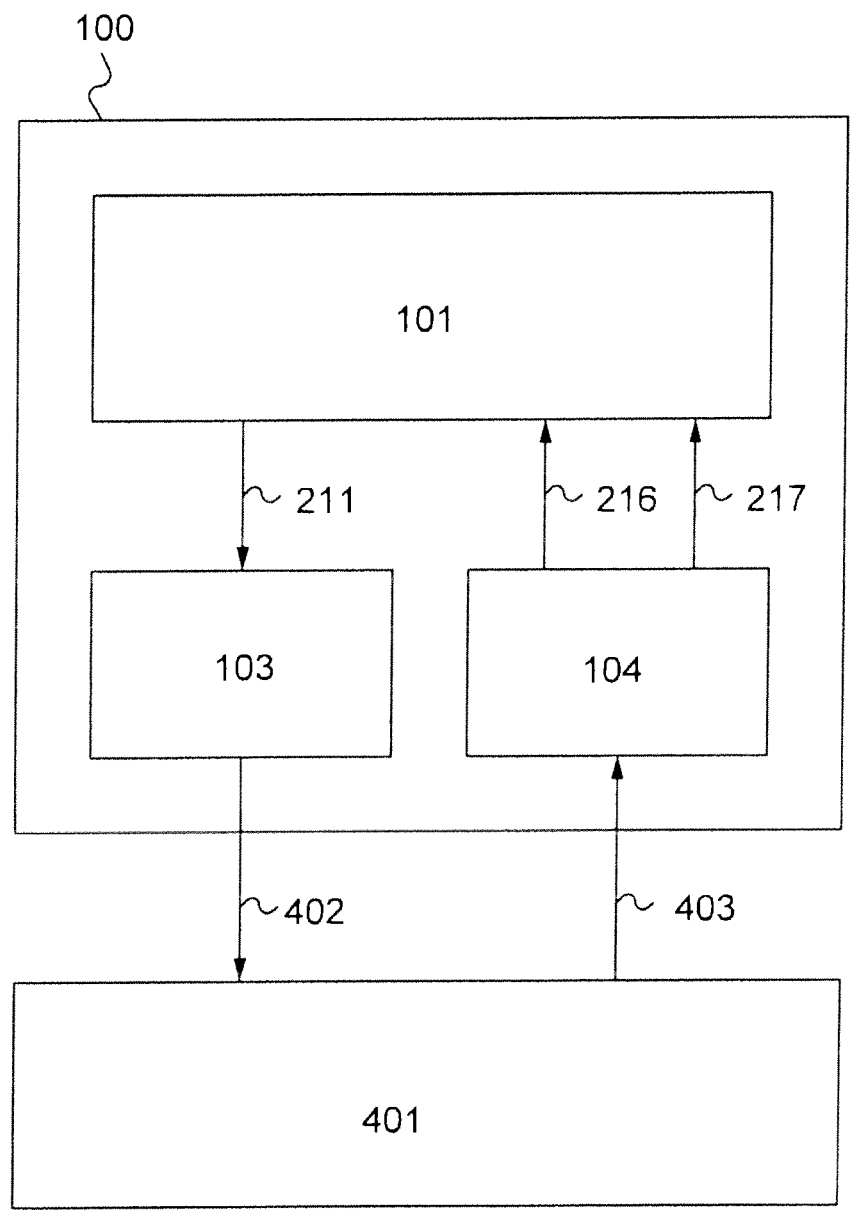
FIG. 4 illustrates a structure of a touch panel.

Then, a driving method of the touch panel in this embodiment of the present invention is described with reference to FIG. 4. In FIG. 4, there are an external processing circuit 401, a photosensor-control-circuit output signal line 402, and a MEMS-control-circuit input signal line 403.

First, when an object to be detected is in contact with the pixel portion 101 of the touch panel 100, the amount of light, with which the photodiode 204 in the photosensor portion 107 included in the pixel 105 in the region of the pixel portion 101 is irradiated, varies. Here, as described above, when the photosensor portion 107 in the region is operated and the amount of light with which the photodiode 204 is irradiated varies, the potential of the photosensor output signal line 211 varies.

Next, the potential of the photosensor output signal line 211 is converted into digital data by an A/D conversion circuit included in the photosensor control circuit 103 of the touch panel 100 and then the digital data is supplied to the external processing circuit 401 by the photosensor-control-circuit output signal line 402. In the external processing circuit 401, arithmetic processing is performed on the digital data, so that the shape, size, and the like of the object to be detected can be extracted. Note that when the photosensor portion 107 is provided in each pixel of R, G, and B, color of the object to be detected can also be extracted. For example, in the case of a person's finger, when the person's finger touches the touch panel with strong power, the display surface touched by a fingertip is broken.

An example of an arithmetic processing method in the external processing circuit 401 can be the following method. First, a person's finger is detected by a known method such as pattern matching to obtain information of the position in the surface in contact with the fingertip. Next, from the area (how much the area is broken), the information of pressure that is applied is obtained. Further, from the information of the position in the surface to which pressure is applied and the information of pressure, the bend (the amount of displacement) of a substrate which overlaps with the pixel portion 101 is calculated. In this way, the positional information in the region which is in contact with the object to be detected and the amount of displacement can be calculated.

Note that, as described above, when an A/D conversion circuit is included in the photosensor control circuit 103, an operation amplifier which is used to extract an analog signal to the outside of the touch panel 100, or the like is not necessary. Therefore, a touch panel which is less likely to be affected by process variations and which can output data at high speed can be provided.

Alternatively, the potential of the photosensor output signal line 211 may be converted into digital data by an A/D conversion circuit included in the external processing circuit 401. In this case, the A/D conversion circuit having a complex structure is not necessary to be included in the touch panel 100; therefore, the manufacturing cost of the touch panel 100 can be easily reduced. Further, it is effective to provide the external processing circuit 401 on the same substrate as the touch panel 100. In this case, the number of components of electronic devices provided with a touch panel can be reduced, and inexpensive electronic devices can be provided.

Then, a control signal in accordance with the region which is in contact with the object to be detected and the detected amount of displacement of the substrate is supplied from the external processing circuit 401 to the MEMS control circuit 104 through the MEMS-control-circuit input signal line 403. In the MEMS control circuit 104, to drive the MEMS element 215 in a pixel of the region which is in contact with the object to be detected, a desired potential is supplied to the MEMS driver signal line 217, and "H" is applied to the gate signal line 216 to which the gate of the transistor 213 is electrically connected. The potential of the MEMS driver signal line 217 is applied to the storage capacitor 214 and the MEMS element 215. Then, the MEMS element 215 generates desired force in a direction perpendicular to both substrate surfaces between a pair of substrates (a TFT substrate and a counter substrate) which form the touch panel. Therefore, a constant distance between the pair of substrates can be kept even when the object to be detected is in contact with the touch panel.

As described above, even when the object to be detected is in contact with the touch panel, a constant distance between the pair of substrates which form the touch panel can be kept. Accordingly, disturbance of display can be reduced. In addition, even when the TFT substrate is held in a chassis, a touch panel in which a bend of the counter substrate can be reduced and the mechanical strength is improved can be provided.

Note that in this embodiment, the case in which a liquid crystal element is used for the display element portion 106 is described; however, this embodiment of the present invention is not limited thereto. A light-emitting element may also be used.

(Embodiment 2)

In this embodiment, a touch panel will be described with reference to FIGS. 5A and 5B.

Figure 5A:
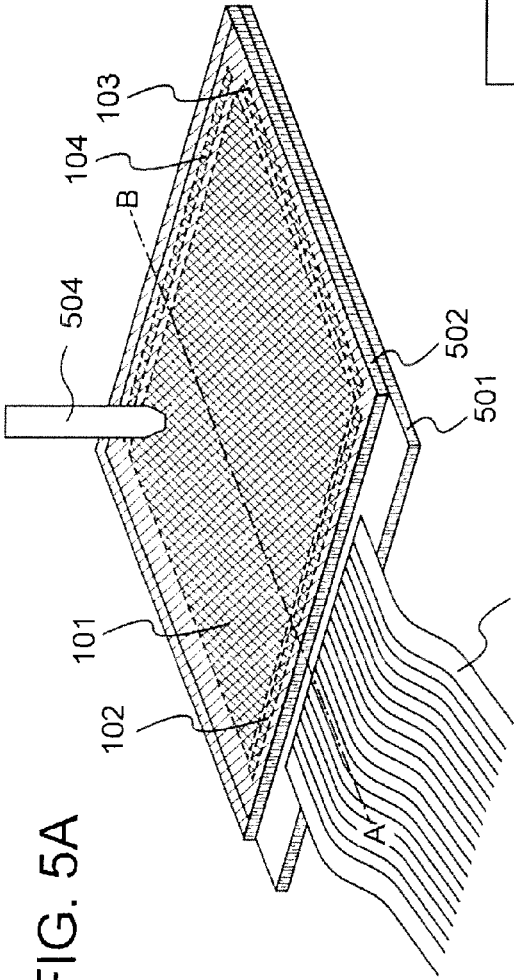
FIGS. 5A and 5B each illustrate a structure of a touch panel.
Figure 5B:
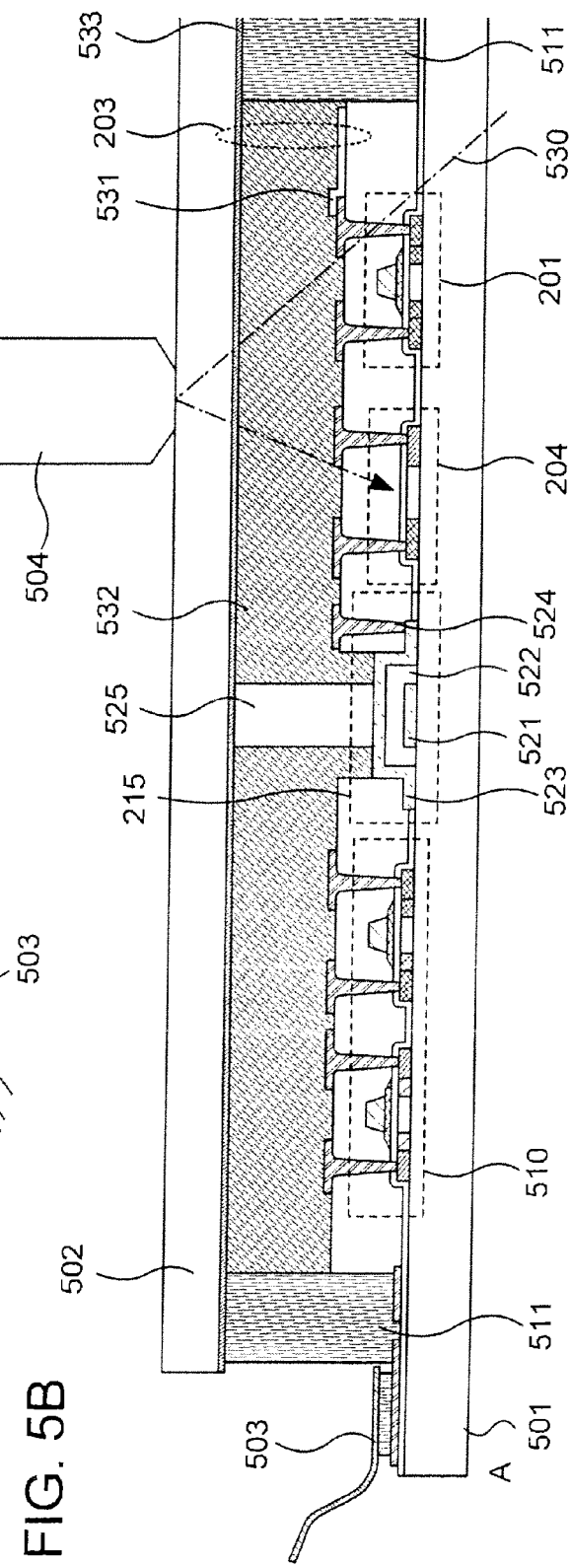

A touch panel includes a substrate 501 having an insulating surface, the pixel portion 101, the display element control circuit 102, the photosensor control circuit 103, the MEMS control circuit 104, a connection film 503, and a counter substrate 502 (see FIG. 5A). The connection film 503 is connected to an external IC chip.

A cross-sectional structure taken along line A-B of the touch panel is described with reference to FIG. 5B. The transistor 201 and the liquid crystal element 203 which are included in the display element portion 106, the photodiode 204 included in the photosensor portion 107, and the MEMS element 215 included in the MEMS portion 108 are illustrated. The liquid crystal element 203 includes a pixel electrode 531, a liquid crystal layer 532, and a counter electrode 533. The MEMS element 215 includes an electrode 521, a hollow region 522, and an electrode 523. Over the electrode 523, a spacer 525 is provided. When a signal is input through a wiring 524, the MEMS element 215 generates a desired displacement in a direction perpendicular to the substrate 501 and the counter substrate 502.

In addition, a CMOS element 510 included in the display element control circuit 102 is illustrated. Note that in FIG. 5B, description of a cross-sectional structure of an element provided in the MEMS control circuit 104 is omitted. A sealant 511 is provided at the periphery of the pixel portion 101, the display element control circuit 102, the photosensor control circuit 103, and the MEMS control circuit 104. The substrate 501 and the counter substrate 502 are attached to each other with the sealant 511.

Note that the transistor formed over the substrate 501 is preferably formed using a crystalline semiconductor layer which has favorable characteristics such as mobility as compared with an amorphous semiconductor. By use of the crystalline semiconductor layer, a monolithic transistor can be realized. As a result, the number of external ICs which are connected to the touch panel can be reduced, and a small, light-weight, thin touch panel can be achieved.

In the touch panel, light 530 which is external light or is emitted from a backlight is reflected at a tip of an object to be detected 504 (e.g., a stylus pen tip), and the reflected light enters the photodiode 204, so that the position indicated by the object to be detected 504 is recognized.

The MEMS element 215 generates a mechanical displacement using mechanical elasticity of the electrode 523 and electrostatic attractive force between the electrode 521 and the electrode 523 generated by a potential between both the electrodes. More specifically, when the potential between the electrode 521 and the electrode 523 increases, the electrostatic attractive force between both the electrodes increases, and an upper portion of the hollow region 522 of the electrode 523 moves to the direction of the electrode 521 side (a lower direction in FIG. 5B). In addition, when the potential between the electrode 521 and the electrode 523 decreases, the electrostatic attractive force between both the electrodes decreases, and the upper portion of the hollow region 522 of the electrode 523 moves to the direction opposite to the electrode 521 side (an upper direction in FIG. 5B), due to the mechanical elasticity of the electrode 523.

The movement of the upper portion of the hollow region 522 of the electrode 523 is transmitted to the counter substrate 502 through the spacer 525. Accordingly, due to the contact of the object to be detected 504, even when the counter substrate 502 receives pressure (to a lower direction in FIG. 5B), force in the opposite direction is generated by the MEMS element 215 and applied to the counter substrate 502, so that a constant distance between the substrate 501 and the counter substrate 502 can be kept. In addition, even when the substrate 501 is held in the chassis, a bend of the counter substrate 502 can be reduced, and the mechanical strength can be maintained.

Note that it is preferable that the vicinity of the electrode 523 be hollow so as not to prevent movement of the upper portion of the hollow region 522 of the electrode 523. Alternatively, it is preferable that the vicinity of the electrode 523 be in contact with only a lubricative material.

This embodiment can be freely combined with any of the above embodiments.

(Embodiment 3)

An example of a cross-sectional structure of a touch panel will be described with reference to FIGS. 6 and 7. First, an example of a cross section of a touch panel using a liquid crystal element as a display element is described with reference to FIG. 6.

As a substrate 800, a light-transmitting substrate such as a glass substrate or a quartz substrate is used. A thin film transistor 801, a thin film transistor 802, a photosensor 803, and a MEMS element 830 are provided over the substrate 800. The photosensor 803 is formed in such a manner that an n-type semiconductor layer 810, an i-type semiconductor layer 811, and a p-type semiconductor layer 812 are stacked in this order. The n-type semiconductor layer 810 contains an impurity element imparting one conductivity type (e.g., phosphorus). The i-type semiconductor layer 811 is an intrinsic semiconductor. The p-type semiconductor layer 812 contains an impurity element imparting one conductivity type (e.g., boron).

The MEMS element 830 includes a coil 541 and a magnet 542. A liquid crystal layer 824 fills a space between the coil 541 and the magnet 542. A spacer 543 is provided to be in contact with the magnet 542. When a signal is input to the coil 541, the MEMS element 830 generates a desired displacement in a direction perpendicular to the substrate 800 and a counter substrate 820.

The MEMS element 830 generates a mechanical displacement due to magnetic force generated between the coil 541 and the magnet 542 when current flows to the coil 541. More specifically, when current which flows to the coil 541 increases, the magnetic force between the coil 541 and the magnet 542 increases, and the magnet 542 moves to an upper direction or a lower direction in FIG. 6. That is, a mechanical displacement increases. Note that when the direction of current which flows to the coil 541 is reversed, the movement direction of the magnet 542, that is, the direction of the mechanical displacement is reversed.

The movement of the magnet 542 is transmitted to the counter substrate 820 through the spacer 543. Accordingly, due to the contact of the object to be detected, even when the counter substrate 820 receives pressure (to a lower direction in FIG. 6), force in the opposite direction is generated by the MEMS element 830 and applied to the counter substrate 820, so that a constant distance between the substrate 800 and the counter substrate 820 can be kept. In addition, even when the substrate 800 is held in the chassis, a bend of the counter substrate 820 can be reduced, and the mechanical strength can be maintained.

Note that it is preferable that the vicinity of the magnet 542 be hollow so as not to prevent movement of the magnet 542. Alternatively, it is preferable that the vicinity of the magnet 542 be in contact with only a lubricative material.

Figure 6:
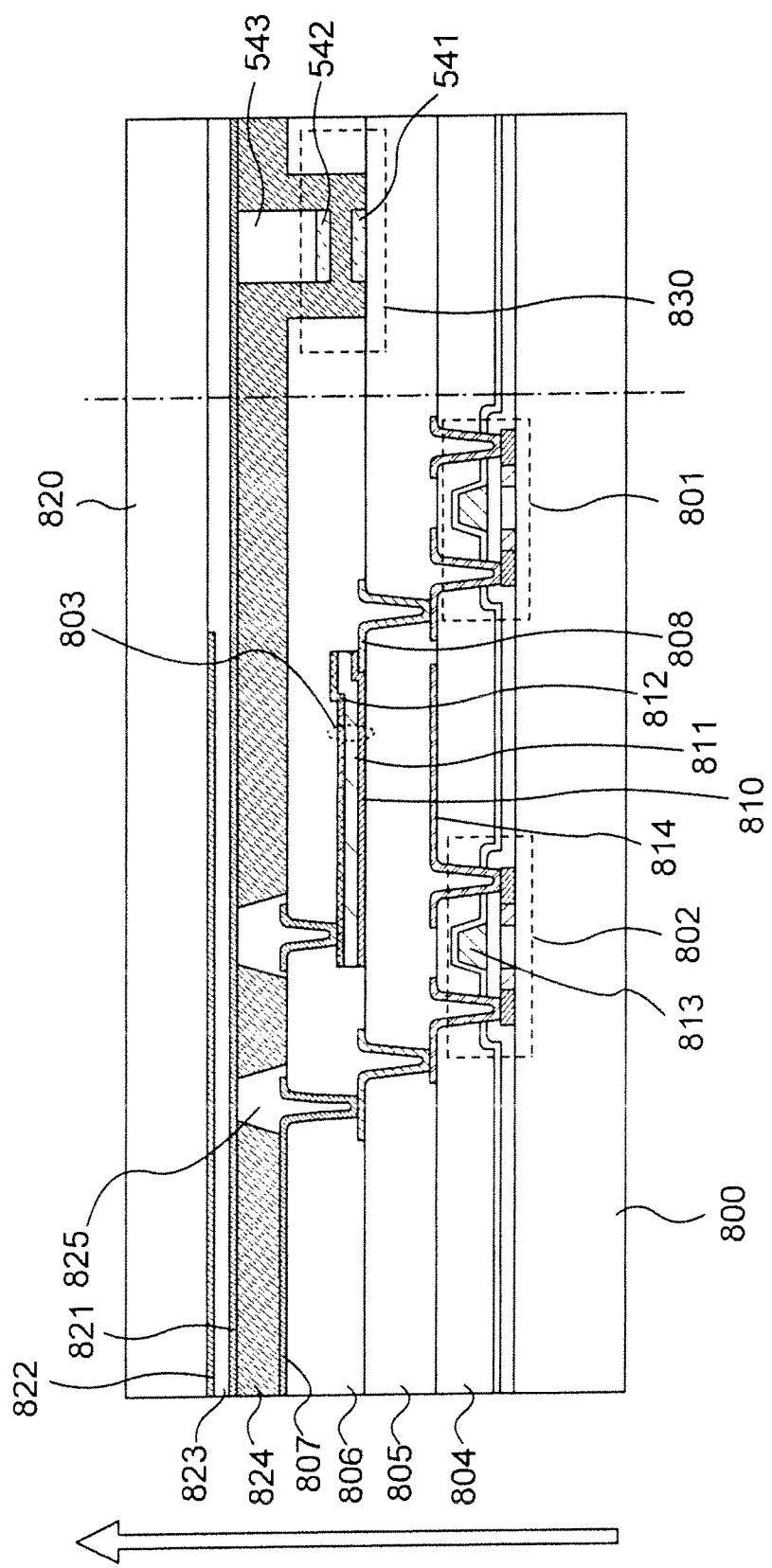
FIG. 6 illustrates a structure of a touch panel.
Figure 7:
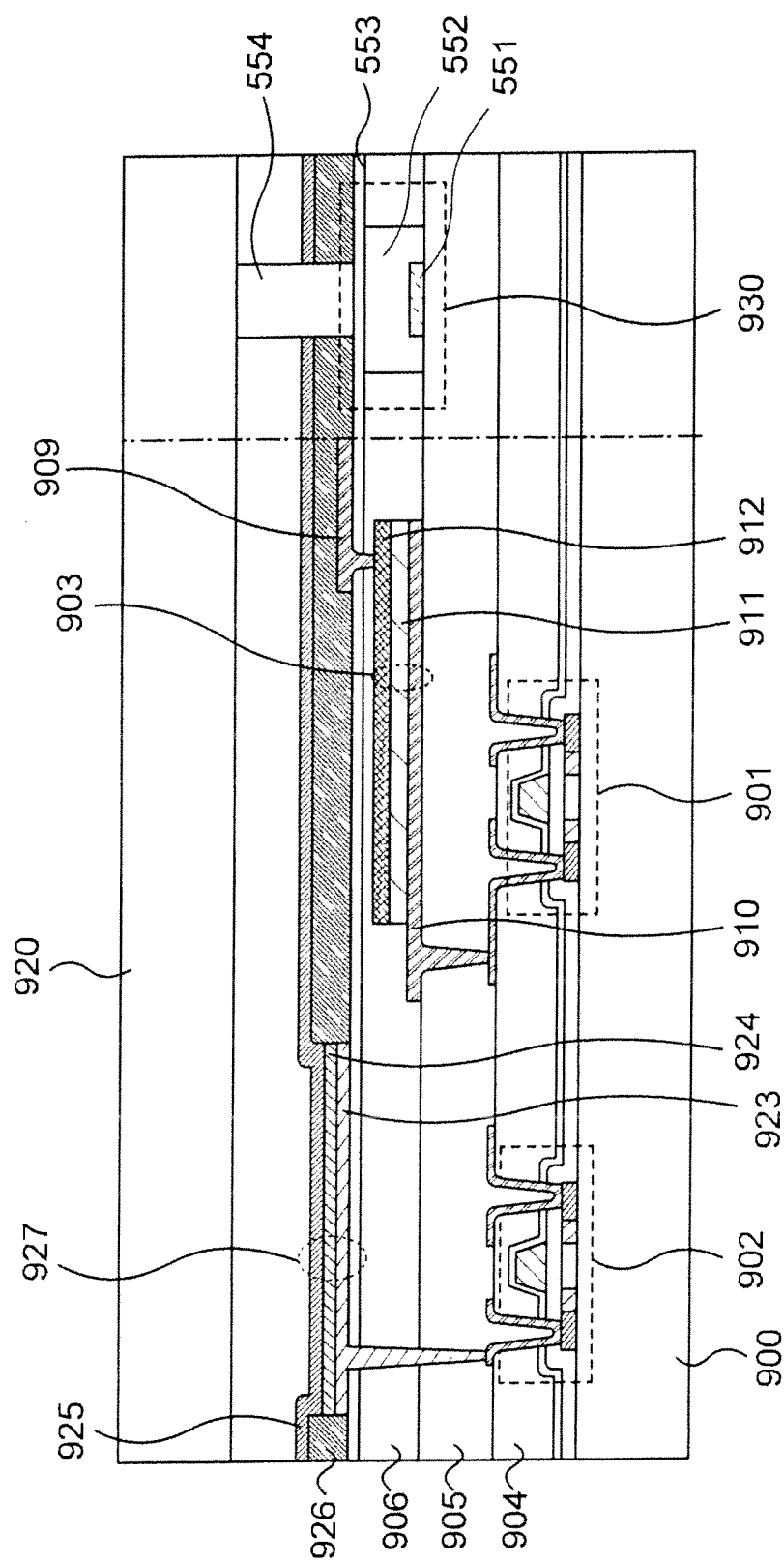
FIG. 7 illustrates a structure of a touch panel.

In FIG. 6, top gate thin film transistors are used as the thin film transistors 801 and 802, but this embodiment is not limited thereto, and bottom gate thin film transistors may also be used. In addition, the structure of the photosensor 803 includes, but is not limited to, the n-type semiconductor layer 810, the i-type semiconductor layer 811, and the p-type semiconductor layer 812.

In this embodiment, a crystalline semiconductor layer can be used for both semiconductor layers of the thin film transistors 801 and 802, such as, but is not limited to, polycrystalline silicon. Each semiconductor layer of the thin film transistors 801 and 802 may be formed using amorphous silicon, single crystal silicon, an organic semiconductor such as pentacene, an oxide semiconductor, or the like. In the case where a semiconductor layer using single crystal silicon is formed over the substrate 800, the substrate 800 is bonded to a single crystal silicon substrate in which a damaged region is provided at a predetermined depth from the surface, and the single crystal silicon substrate is separated at the damaged region. For the oxide semiconductor, composite oxide of an element such as indium, gallium, aluminum, zinc, or tin can be used.

An insulating layer 804 is provided to cover the thin film transistors 801 and 802. An insulating layer 805 is provided over the insulating layer 804, and an insulating layer 806 is provided over the insulating layer 805. A pixel electrode 807 is provided over the insulating layer 806, and the photosensor 803 and a lower electrode 808 are provided over the insulating layer 805. The photosensor 803 and the thin film transistor 801 are electrically connected to each other using the lower electrode 808 through an opening provided in the insulating layer 805.

The counter substrate 820 is provided with a counter electrode 821, a color filter layer 822, and an overcoat layer 823. The counter substrate 820 and the substrate 800 are attached to each other with a sealant, and a substantially constant distance between the substrates is kept by a spacer 825. The pixel electrode 807 and the counter electrode 821 sandwich the liquid crystal layer 824, whereby a liquid crystal element is formed.

The color filter layer 822 may be provided so as to overlap with both the photosensor 803 and the pixel electrode 807 as illustrated in FIG. 6.

The photosensor 803 overlaps with a gate electrode 813 of the thin film transistor 802 as illustrated in FIG. 6 and is preferably provided so as to overlap also with a signal line 814 of the thin film transistor 802.

The touch panel illustrated in FIG. 6 is provided with a backlight, In FIG. 6, the backlight is provided on the substrate 800 side, and light is emitted in a direction indicated by an arrow. A cold-cathode fluorescent lamp (CCFL) or a white light-emitting diode can be used as the backlight. A white light-emitting diode is preferable because the adjustable range of brightness is wider than that of a cold-cathode fluorescent lamp.

For example, the photosensor 803 can also be provided in a driver circuit portion to detect outside light, whereby the brightness (luminance) of the backlight can be adjusted so as to enable display appropriate for the circumstance where the touch panel is used.

The structure of the backlight is not limited to the above structure. For example, color display may be performed in such a manner that the backlight is formed using RGB light-emitting diodes (LED) or that RGB LED backlights sequentially emit light by a field sequential system. A color filter layer is not necessary in that case.

Now, an example of a method for manufacturing the touch panel illustrated in FIG. 6 is briefly described.

First, top gate thin film transistors each including a crystalline semiconductor layer as an active layer are formed. Here, the thin film transistor 802 including the gate electrode 813 and the thin film transistor 801 which is electrically connected to the photosensor 803 are formed over one substrate. An n-channel thin film transistor or a p-channel thin film transistor can be used as these transistors. In addition, a storage capacitor can be formed in the same process as these transistors. As for the storage capacitor, a semiconductor layer may serve as a lower electrode, a capacitor wiring may serve as an upper electrode, and an insulating film formed in the same process as the gate insulating film of the thin film transistors 801 and 802 may serve as a derivative.

Contact holes are formed in the insulating layer 804 which is one of interlayer insulating layers of the thin film transistors, and a source electrode and a drain electrode which are electrically connected to the semiconductor layer of each of the thin film transistors or a connection electrode which is electrically connected to an upper wiring is formed. Moreover, a signal line of the thin film transistor 801 which is electrically connected to the photosensor 803 is formed in the same step. Further, the signal line 814 of the thin film transistor 802 is also formed in the same step.

Next, the insulating layer 805 which covers the signal line 814 is formed. Note that an example of a transmissive liquid crystal display device is described in this embodiment; therefore, an insulating material which transmits visible light is used for the insulating layer 805. Then, a contact hole is formed in the insulating layer 805, and the lower electrode 808 is formed over the insulating layer 805.

Then, the photosensor 803 is formed so as to overlap with at least part of the lower electrode 808. The lower electrode 808 is an electrode for electrically connecting the photosensor 803 and the thin film transistor 801. The photosensor 803 is formed in such a manner that the n-type semiconductor layer 810, the i-type semiconductor layer 811, and the p-type semiconductor layer 812 are stacked in this order. In this embodiment, microcrystalline silicon containing phosphorus, amorphous silicon, and microcrystalline silicon containing boron are formed as the n-type semiconductor layer 810, the i-type semiconductor layer 811, and the p-type semiconductor layer 812 respectively by a plasma-enhanced CVD method.

Next, the insulating layer 806 which covers the photosensor 803 is formed. In the case of a transmissive liquid crystal display device, an insulating material which transmits visible light is used for the insulating layer 806. Then, a contact hole is formed in the insulating layer 806, and the pixel electrode 807 is formed over the insulating layer 806. A wiring which is an upper electrode of the photosensor 803 and is electrically connected to the p-type semiconductor layer 812 is formed using the same layer as the pixel electrode 807.

Next, an opening is formed in the insulating layer 806 and the coil 541 is formed in the opening. Then, the magnet 542 is formed, and the spacer 543 is formed over the magnet 542.

Next, the spacer 825 is formed over the insulating layer 806. In FIG. 6, as the spacer 825, a columnar spacer (a post spacer) is provided; however, a spherical spacer (a bead spacer) may also be used.

Then, when a TN liquid crystal or the like is used as the liquid crystal layer 824, an alignment film is formed over the pixel electrode 807 by coating, and rubbing treatment is performed.

Meanwhile, the counter substrate 820 is provided with the color filter layer 822, the overcoat layer 823, and the counter electrode 821. An alignment film is formed over the counter electrode 821 by coating, and rubbing treatment is performed.

After that, a surface of the substrate 800, over which the alignment film is formed by coating, and a surface of the counter substrate 820, over which the alignment film is formed by coating, are attached to each other with a sealant. A liquid crystal is placed between these substrates by a liquid crystal dripping method or a liquid crystal injection method, whereby the liquid crystal layer 824 is formed.

Alternatively, a blue-phase liquid crystal for which an alignment film is not necessary may be used for the liquid crystal layer 824. A blue phase is one of the liquid crystal phases, which is generated just before a cholesteric phase changes into an isotropic phase while temperature of a cholesteric liquid crystal increases. Since the blue phase appears only in a narrow temperature range, a liquid crystal composition in which 5 wt. % or more of a chiral material is mixed is used for the liquid crystal layer 824 in order to broaden the temperature range. As for the liquid crystal composition which contains a blue-phase liquid crystal and a chiral material, the response speed is as high as 10 μs to 100 μs, alignment treatment is not necessary due to optical isotropy, and viewing angle dependence is low.

Next, as a display element, a touch panel using a light-emitting element (e.g., an organic EL element, an inorganic EL element, or an EL element including an organic material and an inorganic material) is described with reference to FIG. 7.

A thin film transistor 901, a thin film transistor 902, a photosensor 903, and a MEMS element 930 are provided over a substrate 900. The photosensor 903 is formed in such a manner that an n-type semiconductor layer 910, an i-type semiconductor layer 911, and a p-type semiconductor layer 912 are stacked. The MEMS element 930 includes an electrode 551 and a hollow region 552. Over the hollow region 552, a film 553 (e.g., an inorganic insulating film) is provided. Over the film 553, a spacer 554 is provided. The substrate 900 and a counter substrate 920 are attached to each other with a sealant.

An insulating layer 904 is provided to cover the thin film transistors 901 and 902. An insulating layer 905 is provided over the insulating layer 904, and an insulating layer 906 is provided over the insulating layer 905. A light-emitting element 927 is provided over the insulating layer 906, and the photosensor 903 is provided over the insulating layer 905. The photosensor 903 and the thin film transistor 901 are electrically connected to each other using the n-type semiconductor layer 910 of the photosensor 903 through an opening provided in the insulating layer 905.

In addition, the p-type semiconductor layer 912 and another wiring are electrically connected to each other using a wiring 909 for a sensor.

In the light-emitting element 927, a pixel electrode 923, a light-emitting layer 924, and a counter electrode 925 are stacked. The light-emitting layers in adjacent pixels are divided by a bank 926.

An n-channel thin film transistor or a p-channel thin film transistor can be used as the thin film transistors 901 and 902. In the case where the pixel electrode 923 functions as a cathode, in consideration of the current direction, it is preferable that the thin film transistor 902 which is electrically connected to the pixel electrode 923 be formed using an n-channel thin film transistor. In the case where the pixel electrode 923 functions as an anode, the thin film transistor 902 is preferably formed using a p-channel thin film transistor.

In the MEMS element 930, the electrode 551 is provided in the hollow region 552 provided in the insulating layer 906. The hollow region 552 is covered with the film 553. The spacer 554 is provided over the film 553. The electrode 551 is formed using a material which generates heat when a signal is supplied (e.g., metal). When a signal is input to the electrode 551, the MEMS element 930 generates a desired displacement in a direction perpendicular to the substrate 900 and the counter substrate 920.

When current flows to the electrode 551, the electrode 551 generates heat, and the MEMS element 930 generates a mechanical displacement using force which is generated in such a manner that the hollow region 552 is expanded. More specifically, when the amount of current that flows to the electrode 551 increases, the temperature of the electrode 551 becomes higher, whereby the pressure in the hollow region 552 increases and the upper portion of the hollow region 552 in contact with the film 553 moves in the upper direction in FIG. 7. That is, the mechanical displacement increases.

The movement of the upper portion of the hollow region 552 in contact with the film 553 is transmitted to the counter substrate 920 through the spacer 554. Accordingly, due to the contact of the object to be detected, even when the counter substrate 920 receives pressure (to a lower direction in FIG. 7), force in the opposite direction is generated by the MEMS element 930 and applied to the counter substrate 920, so that a constant distance between the substrate 900 and the counter substrate 920 can be kept. In addition, even when the substrate 900 is held in the chassis, a bend of the counter substrate 920 can be reduced, and the mechanical strength can be maintained.

Note that the hollow region 552 is preferably filled with a gas, a liquid, a solid, or the like which expands by heat. In addition, the film 553 can be formed using any material as long as the material has a function of sealing a substance with which the hollow region 552 is filled and a function of transmitting expansion force of the substance to the spacer 554.

This embodiment can be freely combined with any of the above embodiments.

(Embodiment 4)

Examples of electronic devices using a touch panel will be described in this embodiment with reference to FIGS. 8A to 8F.

Figure 8A:
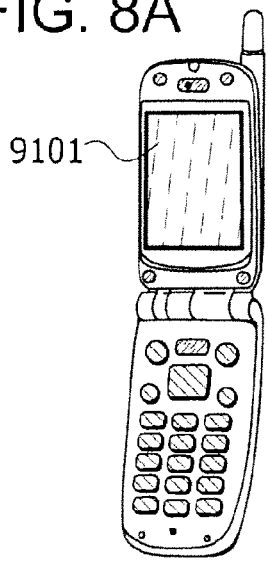
FIGS. 8A to 8F each illustrate an electronic device.
Figure 8B:
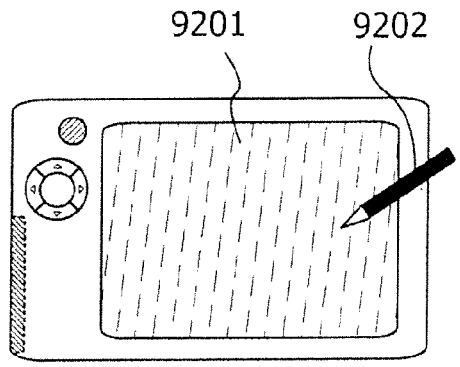
Figure 8C:
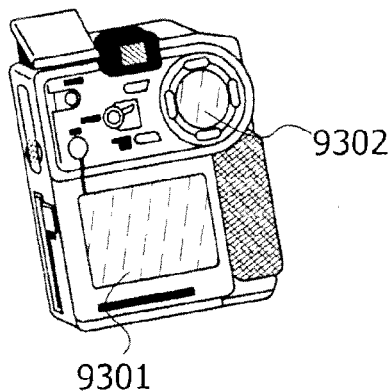
Figure 8D:
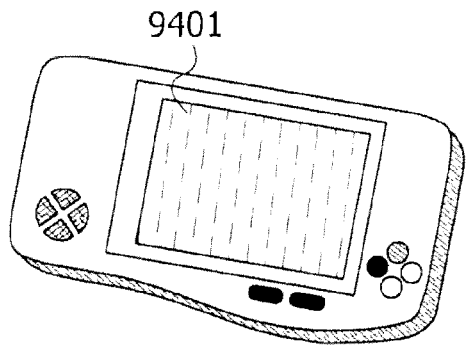
Figure 8E:
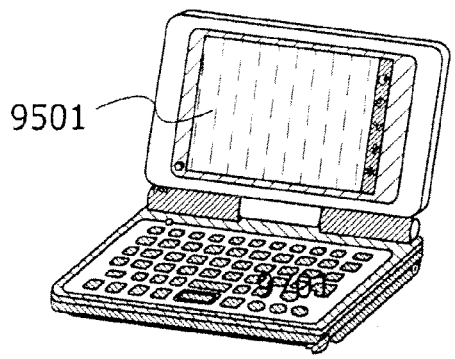
Figure 8F:
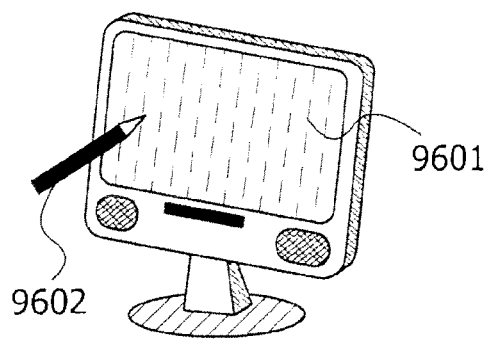

A mobile phone illustrated in FIG. 8A includes a display portion 9101. A portable information terminal illustrated in FIG. 8B includes a display portion 9201, an input pen 9202, and the like. A digital video camera illustrated in FIG. 8C includes a display portion 9301, a display portion 9302, and the like. A portable game machine illustrated in FIG. 8D includes a display portion 9401 and the like. A portable information terminal illustrated in FIG. 8E includes a display portion 9501 and the like. A television device illustrated in FIG. 8F includes a display portion 9601, an input pen 9602, and the like. The touch panel which is one embodiment of the present invention can be used for the electronic devices illustrated in FIGS. 8A to 8F. By use of the touch panel which is one embodiment of the present invention, electronic devices in which disturbance of display can be reduced and whose mechanical strength is improved can be provided.

This embodiment can be freely combined with any of the above embodiments.

This application is based on Japanese Patent Application serial No. 2009-010764 filed with Japan Patent Office on Jan. 21, 2009, the entire contents of which are hereby incorporated by reference.

What is claimed is:

1. A semiconductor device comprising:
a first substrate;
a pixel over the first substrate, the pixel comprising:
a photosensor portion comprising a transistor comprising an oxide semiconductor and a photodiode; and
a MEMS portion comprising a MEMS element, and
a second substrate over the pixel,
wherein an insulating layer is over the transistor,
wherein the photodiode and the MEMS element are over the insulating layer,
wherein the photosensor portion is configured to detect light from an object contacting with a surface of the second substrate to determine a position and an area of a region where the object is contacting the surface of the second substrate,
wherein the MEMS portion corresponding to the position of the region is configured to generate a force corresponding to the area of the region in a direction perpendicular to the first substrate and the second substrate to maintain a constant distance between the first substrate and the second substrate in response to a signal supplied from a processing circuit.

2. The semiconductor device according to claim 1, wherein the photodiode comprises an n-type semiconductor layer, an i-type semiconductor layer, and a p-type semiconductor layer, and
wherein the n-type semiconductor layer, the i-type semiconductor layer, and the p-type semiconductor layer are stacked.

3. The semiconductor device according to claim 1, wherein the MEMS element comprises a first electrode, a second electrode, and a hollow region between the first electrode and the second electrode.

4. The semiconductor device according to claim 1, wherein the MEMS element comprises a coil and a magnet.

5. The semiconductor device according to claim 1, wherein the MEMS element comprises an electrode, an insulating film, and a hollow region between the electrode and the insulating film.

6. A semiconductor device comprising:
a first substrate;
a first pixel and a second pixel over the first substrate, each of the first pixel and the second pixel comprising:
a photosensor portion comprising a transistor comprising an oxide semiconductor and a photodiode; and
a MEMS portion comprising a MEMS element, and
a second substrate over the first pixel and the second pixel,
wherein an insulating layer is over the transistor,
wherein the photodiode and the MEMS element are over the insulating layer,
wherein, in each of the first pixel and the second pixel, the photosensor portion is configured to detect light from an object contacting with a surface of the second substrate to determine a position and an area of a region where the object is contacting the surface of the second substrate,
wherein, in each of the first pixel and the second pixel, the MEMS portion corresponding to the position of the region is configured to generate a force corresponding to the area of the region in a direction perpendicular to the first substrate and the second substrate to maintain a constant distance between the first substrate and the second substrate in response to a signal supplied from a processing circuit.

7. The semiconductor device according to claim 6, wherein the photodiode comprises an n-type semiconductor layer, an i-type semiconductor layer, and a p-type semiconductor layer, and
wherein the n-type semiconductor layer, the i-type semiconductor layer, and the p-type semiconductor layer are stacked.

8. The semiconductor device according to claim 6, wherein, in each of the first pixel and the second pixel, the MEMS element comprises a first electrode, a second electrode, and a hollow region between the first electrode and the second electrode.

9. The semiconductor device according to claim 6, wherein, in each of the first pixel and the second pixel, the MEMS element comprises a coil and a magnet.

10. The semiconductor device according to claim 6, wherein, in each of the first pixel and the second pixel, the MEMS element comprises an electrode, an insulating film, and a hollow region between the electrode and the insulating film.

11. A semiconductor device comprising:
a first substrate;
a plurality of pixels arranged in matrix over the first substrate, each of the plurality of pixels comprising:
a photosensor portion comprising a transistor comprising an oxide semiconductor and a photodiode; and
a MEMS portion comprising a MEMS element, and
a second substrate over the plurality of pixels,
wherein an insulating layer is over the transistor,
wherein the photodiode and the MEMS element are over the insulating layer,
wherein, in each of the plurality of pixels, the photosensor portion is configured to detect light from an object contacting with a surface of the second substrate to determine a position and an area of a region where the object is contacting the surface of the second substrate,
wherein, in each of the plurality of pixels, the MEMS portion corresponding to the position of the region is configured to generate a force corresponding to the area of the region in a direction perpendicular to the first substrate and the second substrate to maintain a constant distance between the first substrate and the second substrate in response to a signal supplied from a processing circuit.

12. The semiconductor device according to claim 11,
wherein the photodiode comprises an n-type semiconductor layer, an i-type semiconductor layer, and a p-type semiconductor layer, and
wherein the n-type semiconductor layer, the i-type semiconductor layer, and the p-type semiconductor layer are stacked.

13. The semiconductor device according to claim 11,
wherein, in each of the plurality of pixels, the MEMS element comprises a first electrode, a second electrode, and a hollow region between the first electrode and the second electrode.

14. The semiconductor device according to claim 11,
wherein, in each of the plurality of pixels, the MEMS element comprises a coil and a magnet.

15. The semiconductor device according to claim 11,
wherein, in each of the plurality of pixels, the MEMS element comprises an electrode, an insulating film, and a hollow region between the electrode and the insulating film.

* * * * *